United States Patent
Amit et al.

(10) Patent No.: US 9,252,807 B2
(45) Date of Patent: Feb. 2, 2016

(54) EFFICIENT ONE-PASS CACHE-AWARE COMPRESSION

(71) Applicant: GLOBALFOUNDRIES INC., Grand Cayman (KY)

(72) Inventors: Jonathan Amit, Omer (IL); Jonathan Fischer-Toubol, Tel Aviv (IL); Nir Halowani, Holon (IL); Danny Harnik, Tel Mond (IL); Ety Khaitzin, Holon (IL); Sergey Marenkov, Yehud (IL); Gil Shapira, Givatayim (IL); Dmitry Sotnikov, Givataim (IL); Shai Tahar, Petach Tikva (IL)

(73) Assignee: GLOBALFOUNDRIES INC., Grand Cayman (KY)

( * ) Notice: Subject to any disclaimer, the term of this patent is extended or adjusted under 35 U.S.C. 154(b) by 126 days.

(21) Appl. No.: 14/059,400

(22) Filed: Oct. 21, 2013

(65) Prior Publication Data
US 2015/0113220 A1    Apr. 23, 2015

(51) Int. Cl.
| | |
|---|---|
| H03M 7/42 | (2006.01) |
| G06F 12/08 | (2006.01) |
| H03M 7/30 | (2006.01) |
| H03M 7/40 | (2006.01) |

(52) U.S. Cl.
CPC ............ *H03M 7/42* (2013.01); *G06F 12/0811* (2013.01); *H03M 7/3086* (2013.01); *H03M 7/40* (2013.01); *H03M 7/6005* (2013.01); *H03M 7/6011* (2013.01); *G06F 2212/401* (2013.01)

(58) Field of Classification Search
None
See application file for complete search history.

(56) References Cited

U.S. PATENT DOCUMENTS

| | | | |
|---|---|---|---|
| 7,155,062 B1 | 12/2006 | Stoica | |
| 2004/0190635 A1* | 9/2004 | Ruehle | 375/253 |
| 2007/0109153 A1* | 5/2007 | Ma et al. | 341/50 |
| 2008/0144953 A1 | 6/2008 | Imafuku | |
| 2009/0002207 A1* | 1/2009 | Harada et al. | 341/51 |
| 2009/0058693 A1* | 3/2009 | Laker et al. | 341/65 |
| 2010/0182170 A1* | 7/2010 | Ylonen | 341/65 |

FOREIGN PATENT DOCUMENTS

| | | |
|---|---|---|
| CN | 1655460 A | 8/2005 |
| CN | 102136270 A | 7/2011 |
| CN | 102970043 A | 3/2013 |
| CN | 102983866 A | 3/2013 |
| EP | 1233522 A1 | 2/2003 |
| WO | 2009005758 A2 | 1/2009 |

OTHER PUBLICATIONS

SPI DST, et al., Bounding the Depth of Search Trees, Mar. 30, 2007, 27 pgs, Software Patent Institute.
SPI DST, et al., Extension of the Huffman Tree Construction Algorithm, Apr. 23, 2007, 43 pgs, Software Patent Institute.
Lv et al., Fast DCT Algorithm on Video Controller's REALIZATION4 pgs, vol. 12, No. 3, Electric Machines and Control, China.

* cited by examiner

*Primary Examiner* — Ryan Bertram

(57) ABSTRACT

Exemplary method, system, and computer program product embodiments for efficient one-pass cache-aware compression are provided. In one embodiment, by way of example only, an output of a fast compressor to Huffman encoding for achieving the one-pass cache-aware compression by using a predetermined Huffman-tree upon determining by the fast compressor a final representation of each data byte.

17 Claims, 8 Drawing Sheets

EFFICIENT ONE-PASS CACHE-AWARE COMPRESSION

BACKGROUND OF THE INVENTION

1. Field of the Invention

The present invention relates generally to computers, and more particularly, to efficient one-pass cache-aware compression in a computing storage environment.

2. Description of the Related Art

In today's society, computer systems are commonplace. Computer systems may be found in the workplace, at home, or at school. Computer systems may include data storage systems, or disk storage systems, to process and store data. In recent years, both software and hardware technologies have experienced amazing advancement. With the new technology, more and more functions are added and greater convenience is provided for use with these electronic appliances. The amount of information to be processed nowadays increases greatly. One popular method of handling large data files is to compress the data for storage or transmission. Therefore, processing very large amounts of information is a key problem to solve. Therefore, a need exists to improve the compression of data in computing systems.

SUMMARY OF THE DESCRIBED EMBODIMENTS

In one embodiment, a method is provided for efficient one-pass cache-aware compression in a computing environment. In one embodiment, by way of example only, an output of a fast compressor is linked to Huffman encoding for achieving the one-pass cache-aware compression by using a predetermined Huffman-tree upon determining by the fast compressor a final representation of each data byte.

In another embodiment, a computer system is provided for efficient one-pass cache-aware compression using at least one processor device, in a computing environment. The computer system includes a computer-readable medium and a processor in operable communication with the computer-readable medium. In one embodiment, by way of example only, at least one of the processor devices links an output of a fast compressor to Huffman encoding for achieving the one-pass cache-aware compression by using a predetermined Huffman-tree upon determining by the fast compressor a final representation of each data byte.

In a further embodiment, a computer program product is provided for efficient one-pass cache-aware compression using at least one processor device, in a computing environment. The non-transitory computer-readable storage medium has computer-readable program code portions stored thereon. The computer-readable program code portions include executable portions that links an output of a fast compressor to Huffman encoding for achieving the one-pass cache-aware compression by using a predetermined Huffman-tree upon determining by the fast compressor a final representation of each data byte.

In addition to the foregoing exemplary method embodiment, other exemplary system and computer product embodiments are provided and supply related advantages. The foregoing summary has been provided to introduce a selection of concepts in a simplified form that are further described below in the Detailed Description. This Summary is not intended to identify key features or essential features of the claimed subject matter, nor is it intended to be used as an aid in determining the scope of the claimed subject matter. The claimed subject matter is not limited to implementations that solve any or all disadvantages noted in the background.

BRIEF DESCRIPTION OF THE DRAWINGS

In order that the advantages of the invention will be readily understood, a more particular description of the invention briefly described above will be rendered by reference to specific embodiments that are illustrated in the appended drawings. Understanding that these drawings depict embodiments of the invention and are not therefore to be considered to be limiting of its scope, the invention will be described and explained with additional specificity and detail through the use of the accompanying drawings, in which.

DETAILED DESCRIPTION OF CERTAIN EMBODIMENTS

Figure 1:
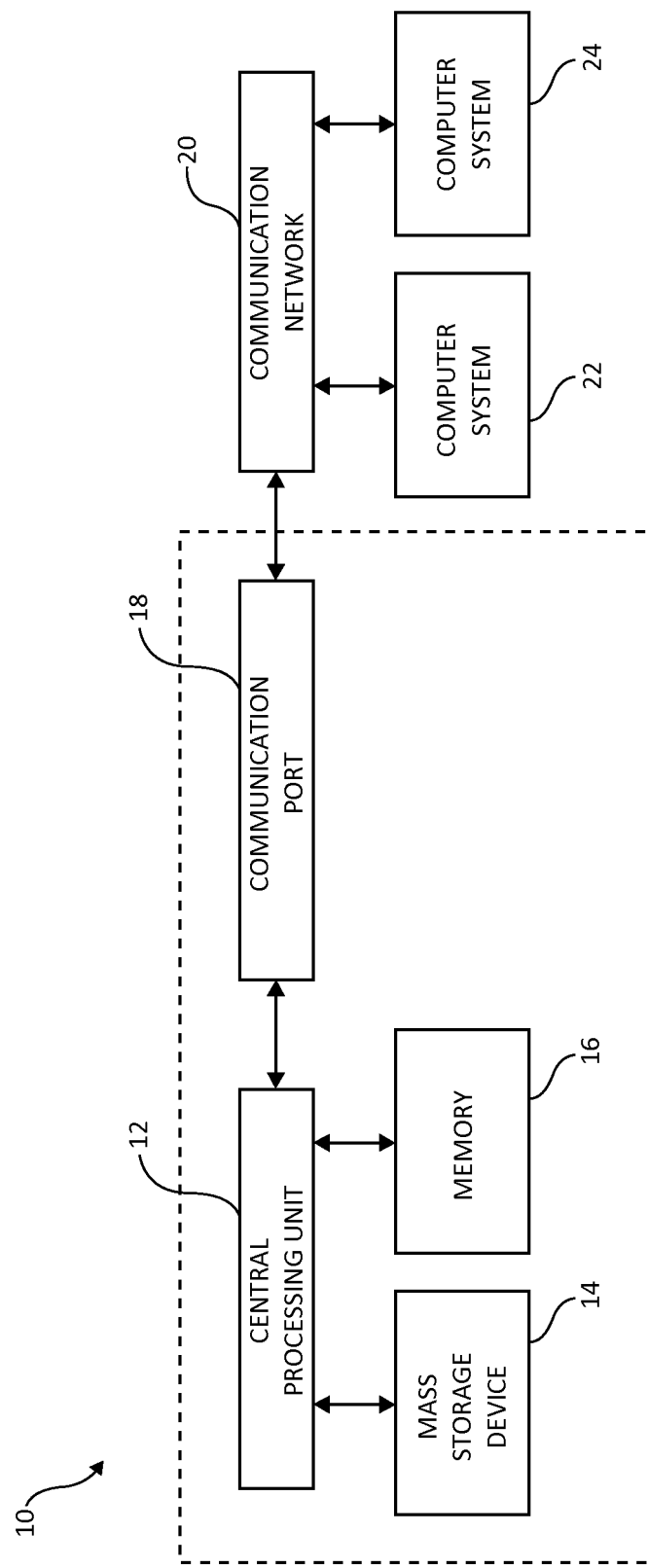
FIG. 1 illustrates a computer storage environment having an example storage device in which aspects of the present invention may be realized.

With increasing demand for faster, more powerful and more efficient ways to store information, optimization of storage technologies is becoming a key challenge. Logical data objects (data files, image files, data blocks, etc.) may be compressed for transmission and/or storage. In one embodiment, data compression techniques are used to reduce the amount of data to be stored and/or transmitted in order to reduce the storage capacity and/or transmission time respectively. For increasing the speed of lossless data compression "fast compressors/decompressors" may be used with an emphasis of speed rather than compression ratio. However, since the output of the fast compressor does not follow the common standard, a need exist that merges the benefits of both "fast compressors/decompressors" and Huffman encoding to achieve compression ratios while maintaining compatibility with the data compression standards. Thus, the present invention addresses these challenges by providing an algorithm for merging fast compressors, with the Huffman encoding.

In one embodiment, Deflate may be used, which is a lossless data compression algorithm defined in RFC 1951 with compression/decompression standards being supported by a variety of browsers and accelerators. Deflate uses a combination of the Lempel-Ziv algorithm (LZ77) that eliminates repetitions and Huffman coding. In one embodiment, a variety of implementations to the Deflate standard in software and hardware are provided (e.g., Zlib compressors). The Deflate standard consists of employing two distinct compression algorithms sequentially: first a repetition finding Lempel-Ziv algorithm (LZ77) type compression followed by a Huffman encoding compression. The Huffman encoding is entropy encoding that is based on a "Huffman tree". In order to Huffman encode and decode data, a system must know in advance that the Huffman tree is being used. In order to accommodate decompression (e.g., an "Inflate" operation), this Huffman tree is written at the header of every compressed block. In one embodiment, there are two options for Huffman trees in the Deflate standard. One is a "static" tree, which is a single hard-coded Huffman tree, known to all compressors and decompressors. The advantage of using this static tree is that its description does not have to be written in the header of a compressed block, and is ready for immediate decompression. On the other hand "dynamic" trees are tailored for the data block at hand and an exact description of the dynamic tree must therefore be written to the output.

Also, Huffman encoding may use a variable-length code table based on entropy to encode source symbols, and as previously mentioned, is defined either as either static or dynamic. In static Huffman coding, each literal or distance is encoded using a fixed table (SHT) that is defined in the RFC. In dynamic Huffman coding, however, special coding tables (DHT) are constructed to better suit the statistics of the data being compressed. In most cases, using DHT achieves better compression ratio (e.g., quality) when compared to SHT, at the expense of degrading the compression rate (e.g., performance) and adding design complexity. The static and dynamic Huffman encoding methods best reflect the built-in tradeoff between compression rate and ratio. The static Huffman method achieves a lower compression ratio than is possible. This is due to using a fixed encoding table regardless of the content of the input data block. For example, random data and a four-letter DNA sequence would be encoded using the same Huffman table.

Since the Zlib compression algorithm employs both the Lempel-Ziv77 type compression followed by a layer of a Huffman encoding it achieves an increased compression ratio when the techniques are performed effectively. Even more so, the output adheres to a well-accepted standard (the Deflate— RFC 1951 standard). As such, it is supported by a wide variety of hardware compression and decompression accelerators, as well as all web browser and applications that use standard compression.

In one embodiment, for increasing the speed of lossless data compression, "fast compressors/decompressors" may be used and the fast compressors put an emphasis of speed rather than compression ratio. The fast compressors each carry their own output format and avoid using Huffman encoding due to its relatively heavy implementation cost. Rather, the fast compressors work at full byte level and implement a speedy Lempel-Ziv77 algorithm; such compressors may include LZ4 and Snappy. A key to the speed of these fast compressors is careful memory management, which optimizes usage of a L1 cache in processors. More specifically, in one embodiment, the fast compressors attempt to maintain the "hot" portion of the memory being used as small as possible, and this allows this to stay inside the L1 cache and achieve high performance of the compression process.

However, since the output of the fast compressor does not follow the common standard, a need exist that merges the benefits of both "fast compressors/decompressors" and Zlib compression algorithms to achieve compression ratios close to those provided by the Zlib, and also maintains Deflate/ Inflate compatibility with the RFC standards, yet achieve improved compression speeds closer to those supplied by the fast compressors. Thus, in one embodiment, the present invention may replace the repetition finding part of Zlib (the LZ77 part) with a fast compressor like LZ4. However, this indeed will improve compression speed, but does not benefit from some of the optimizations of fast compression. The main reason is that the Zlib Huffman part first waits for the repetition finding part to finish running on a certain block (typically a number of Kbytes), then uses the statistics collected on this output block to generate a Huffman encoding tree, and only then Huffman encodes the result. This two-pass approach causes relevant data to be evacuated from the L1 cache and later recalled from L2 cache. Much of the effectiveness of the fast compressor is hence lost.

Thus, the present invention addresses these challenges by providing an algorithm for merging fast compressors, with the Zlib Huffman encoding. In one embodiment, the present invention achieves a Deflate compatible algorithm with significantly improved performance via links between a fast compressor's output and a Huffman encoding of Deflate in a manner that provides for one-pass (e.g., one-pass cache-aware compression) as compared to the two-pass approach, as described above. In so doing, the present invention enables and allows for keeping the relevant data in the L1 cache during the encoding process, and therefore, does not tax the performance of fast compressor. In one embodiment, the present invention avoids using a dynamic Huffman tree that is calculated only after the LZ part is finished, and instead, uses a pre-determined Huffman tree. It should be noted that the default static tree of the Deflate standard is a natural option for this (although not the only option) and that simply forcing usage of the static tree will still perform a two-pass on the data (first LZ and then Huffman). Thus, the present invention Huffman encodes each byte once its final representation in the fast LZ compressor is determined. Since the Huffman encoding is pre-determined, the final encoding of such a byte may be finalized once the fast LZ compressor determines it. By using this immediate encoding, the output of the fast LZ compressor is prevented from moving out of the L1 cache until its encoding is finished, and hence, there is no need to recall this data (or other "hot" data) from L2 cache during the compression process.

In one embodiment, by way of example only, a Huffman tree is computed based on statistics collected on the prefix of the data alone, and uses the Huffman tree as the pre-determined tree for subsequent encoding. Combining the calculated Huffman tree with a fast LZ compressor provides both fast compression with improved memory usage and an increased compression ratio for workloads that maintain the general frequencies of the LZ output over longer time periods.

In one embodiment, efficient one-pass cache-aware compression is achieved by linking an output of a fast compressor to Huffman encoding for achieving the one-pass cache-aware compression by using a predetermined Huffman-tree for the Huffman encoding all bytes of data upon determining, by the fast compressor, a final representation of each of the bytes. Relevant data is retained in an L1 cache during the Huffman encoding process without extracting data from an L2 cache during the Huffman encoding. The predetermined Huffman-tree may be computed based a multiplicity of statistic collected on a prefix of data and the predetermined Huffman-tree is used for subsequent encoding. Also, the predetermined Huffman-tree may be recalculated after every an X number of encoded bytes. The "X" is a value that may be a predetermined value and/or a computed value calculated on the plurality of statistics and historical performance.

In one embodiment, at least one of a multiplicity of predetermined Huffman-trees is selected based on a variety of types of information and/or historical and/or current performance for the linking. In another embodiment, an internal state is added to the fast compressor containing the compressor metadata as well as the Huffman tree data and the internal state is saved between consequent calls to a compression stream to allow efficient compression in a streaming use case where data arrives in chunks rather than a single larger block of data.

Thus, as described herein, the present invention 1) recalculates a pre-determined Huffman tree after every X encoded bytes (for some parameter "X", that may either be set in advance and/or computed based on statistics and/or historical and/or current performance); 2) chooses between several predetermined Huffman trees based on recent history and/or other information that might be available (such as the language of the underlying text); and/or 3) adds an internal state to the fast LZ compressors and save this state between consequent calls to the compression stream. This would achieve a higher compression ratio and full compatibility with the Zlib interface and functionality.

In one embodiment, the present invention reads a literal from an input of data, determines if the literal is part of a minimal size repetition, Huffman encodes the literal, and/or Huffman encodes the minimal size repetition. In one embodiment, the present invention immediately Huffman encodes a byte when the fast compressor is ready to write a byte to the final representation output, Huffman encodes the accumulated probability for each of a code context in accordance with a probability-mapping table, and/or maps the accumulated probability for each of the code context to the short code.

Turning to FIG. 1, an example computer system 10 is depicted in which aspects of the present invention may be realized. Computer system 10 includes central processing unit (CPU) 12, which is connected to mass storage device(s) 14 and memory device 16. Mass storage devices may include hard disk drive (HDD) devices, which may be configured in a redundant array of independent disks (RAID). The backup operations further described may be executed on device(s) 14, located in system 10 or elsewhere. Memory device 16 may include such memory as electrically erasable programmable read only memory (EEPROM) or a host of related devices. Memory device 16 and mass storage device 14 are connected to CPU 12 via a signal-bearing medium. In addition, CPU 12 is connected through communication port 18 to a communication network 20, having an attached plurality of additional computer systems 22 and 24. The computer system 10 may include one or more processor devices (e.g., CPU) to execute and perform each operation described herein to accomplish the purposes of the present invention.

Figure 2A:
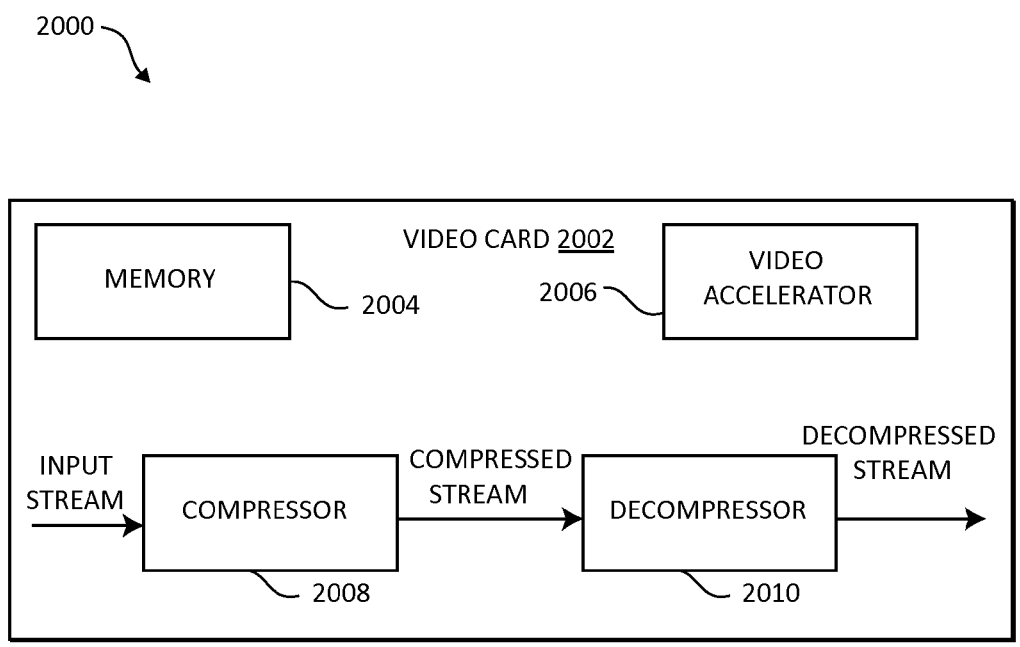
FIG. 2A illustrates an exemplary block diagram showing a hardware structure of a data compression system in a computer system in which aspects of the present invention may be realized.

FIG. 2A illustrates an exemplary block diagram showing a hardware structure of a data compression system in a computer system in which aspects of the present invention may be realized. A compressor 2008 receives an input stream of data bytes and outputs a compressed stream in a video card 2002 having a memory 2004 and a video accelerator 2006. In one embodiment, the description of FIG. 2A of the video card 2002 may also be a graphics accelerator card 2002, a float-point accelerator card 2002, a game console card 2002, a mobile phone chipset 2002, a video display controller 2002, a GPU cluster 2002, a data stream unit 2002, a data processing unit 2002, and the like. A decompressor 2010 receives the compressed stream and outputs a decompressed stream that is identical to the input stream. In one embodiment, the video card 2002, video accelerator 2002, the compressor 2008, and decompressor 2010 may be implemented on a computer system comprising a central processing unit, a memory, and input/output devices (see FIG. 1 and FIG. 2B). In alternate embodiments, the compressor 2008 and decompressor 2010 are implemented using a special-purpose computer system or using discrete logic devices. The compressor 2008 and decompressor 2010 may be used to compress and decompress various types of data including data stored in memory, stored on disk, or transmitted on a communications channel. The compressed stream output by the compressor 2008 can be either stored for later decompression or transmitted to a remote location where it is decompressed. The decompressor 2010 may include a LZ77 decoder (not shown). The LZ77 decoder outputs the single byte decoded from each literal to the decompressed stream.

Figure 2B:
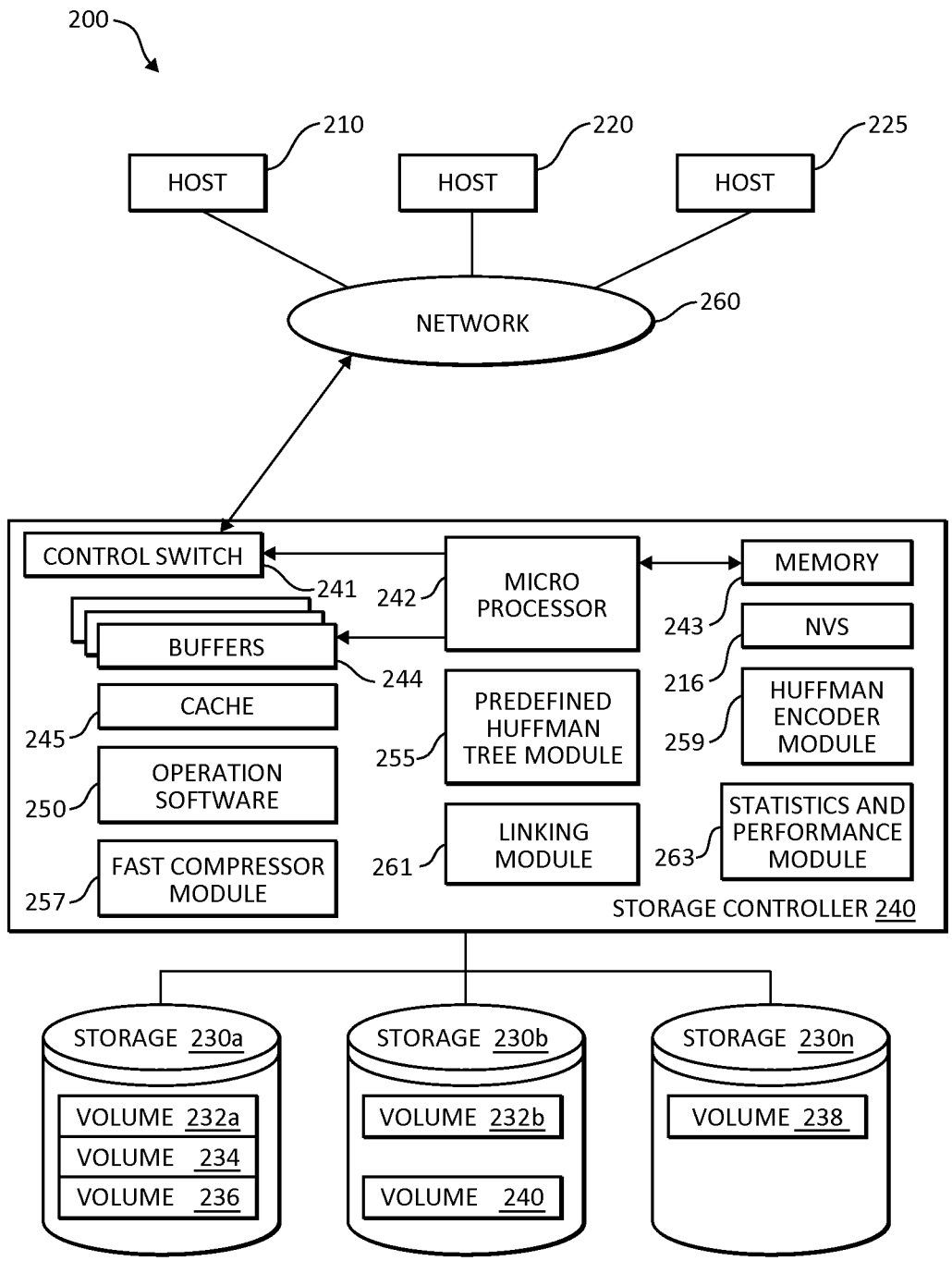
FIG. 2B illustrates an exemplary block diagram showing a hardware structure of a data storage system in a computer system in which aspects of the present invention may be realized

FIG. 2B is an exemplary block diagram 200 showing a hardware structure of a data storage system in a computer system according to the present invention. Host computers 210, 220, 225, are shown, each acting as a central processing unit for performing data processing as part of a data storage system 200. The cluster hosts/nodes (physical or virtual devices), 210, 220, and 225 may be one or more new physical devices or logical devices to accomplish the purposes of the present invention in the data storage system 200. In one embodiment, by way of example only, a data storage system 200 may be implemented as IBM® ProtecTIER® deduplication system TS7650G™. A Network connection 260 may be a fibre channel fabric, a fibre channel point to point link, a fibre channel over ethernet fabric or point to point link, a FICON or ESCON I/O interface, any other I/O interface type, a wireless network, a wired network, a LAN, a WAN, heterogeneous, homogeneous, public (i.e. the Internet), private, or any combination thereof. The hosts, 210, 220, and 225 may be local or distributed among one or more locations and may be equipped with any type of fabric (or fabric channel) (not shown in FIG. 2) or network adapter 260 to the storage controller 240, such as Fibre channel, FICON, ESCON, Ethernet, fiber optic, wireless, or coaxial adapters. Data storage system 200 is accordingly equipped with a suitable fabric (not shown in FIG. 2) or network adaptor 260 to communicate. Data storage system 200 is depicted in FIG. 2 comprising storage controllers 240 and cluster hosts 210, 220, and 225. The cluster hosts 210, 220, and 225 may include cluster nodes.

To facilitate a clearer understanding of the methods described herein, storage controller 240 is shown in FIG. 2 as a single processing unit, including a microprocessor 242, system memory 243 and nonvolatile storage ("NVS") 216. It is noted that in some embodiments, storage controller 240 is comprised of multiple processing units, each with their own processor complex and system memory, and interconnected by a dedicated network within data storage system 200. Storage 230 (labeled as 230a, 230b, and 230n in FIG. 3) may be comprised of one or more storage devices, such as storage arrays, which are connected to storage controller 240 (by a storage network) with one or more cluster hosts 210, 220, and 225 connected to each storage controller 240.

In some embodiments, the devices included in storage 230 may be connected in a loop architecture. Storage controller 240 manages storage 230 and facilitates the processing of write and read requests intended for storage 230. The system memory 243 of storage controller 240 stores program instructions and data, which the processor 242 may access for executing functions and method steps of the present invention for executing and managing storage 230 as described herein. In one embodiment, system memory 243 includes, is in association with, or is in communication with the operation software 250 for performing methods and operations described herein. As shown in FIG. 2, system memory 243 may also include or be in communication with a cache 245 for storage 230, also referred to herein as a "cache memory", for buffering "write data" and "read data", which respectively refer to write/read requests and their associated data. In one embodiment, cache 245 is allocated in a device external to system memory 243, yet remains accessible by microprocessor 242 and may serve to provide additional security against data loss, in addition to carrying out the operations as described in herein.

In some embodiments, cache 245 is implemented with a volatile memory and non-volatile memory and coupled to microprocessor 242 via a local bus (not shown in FIG. 2) for enhanced performance of data storage system 200. The NVS 216 included in data storage controller is accessible by microprocessor 242 and serves to provide additional support for operations and execution of the present invention as described in other figures. The NVS 216, may also referred to as a "persistent" cache, or "cache memory" and is implemented with nonvolatile memory that may or may not utilize external power to retain data stored therein. The NVS may be stored in and with the cache 245 for any purposes suited to accomplish the objectives of the present invention. In some embodiments, a backup power source (not shown in FIG. 2), such as a battery, supplies NVS 216 with sufficient power to retain the data stored therein in case of power loss to data storage system 200. In certain embodiments, the capacity of NVS 216 is less than or equal to the total capacity of cache 245.

Storage 230 may be physically comprised of one or more storage devices, such as storage arrays. A storage array is a logical grouping of individual storage devices, such as a hard disk. In certain embodiments, storage 230 is comprised of a JBOD (Just a Bunch of Disks) array or a RAID (Redundant Array of Independent Disks) array. A collection of physical storage arrays may be further combined to form a rank, which dissociates the physical storage from the logical configuration. The storage space in a rank may be allocated into logical volumes, which define the storage location specified in a write/read request.

In one embodiment, by way of example only, the storage system as shown in FIG. 2 may include a logical volume, or simply "volume," may have different kinds of allocations. Storage 230a, 230b and 230n are shown as ranks in data storage system 200, and are referred to herein as rank 230a, 230b and 230n. Ranks may be local to data storage system 200, or may be located at a physically remote location. In other words, a local storage controller may connect with a remote storage controller and manage storage at the remote location. Rank 230a is shown configured with two entire volumes, 234 and 236, as well as one partial volume 232a. Rank 230b is shown with another partial volume 232b. Thus volume 232 is allocated across ranks 230a and 230b. Rank 230n is shown as being fully allocated to volume 238—that is, rank 230n refers to the entire physical storage for volume 238. From the above examples, it will be appreciated that a rank may be configured to include one or more partial and/or entire volumes. Volumes and ranks may further be divided into so-called "tracks," which represent a fixed block of storage. A track is therefore associated with a given volume and may be given a given rank.

The storage controller 240 (and/or other hardware component associated and controlled by a processor device which may not be illustrated in FIG. 2 but used/employed by one of ordinary skill in the art) may include a predefined Huffman tree module 255, a fast compressor module 257, a Huffman Encoder module 259, a linking module 261, and a statistics and performance module 263. The predefined Huffman tree module 255, the fast compressor module 257, the Huffman encoder module 259, the linking module 261, and the statistics and performance module 263 may work in conjunction with each and every component of the storage controller 240, the hosts 210, 220, 225, and storage devices 230. The predefined Huffman tree module 255, the fast compressor module 257, the Huffman encoder module 259, the linking module 261, and the statistics and performance module 263 may be structurally one complete module or may be associated and/or included with other individual modules. The predefined Huffman tree module 255, the fast compressor module 257, the Huffman encoder module 259, the linking module 261, and the statistics and performance module 263 may also be located in the cache 245 or other components.

The storage controller 240 includes a control switch 241 for controlling the fiber channel protocol to the host computers 210, 220, 225, a microprocessor 242 for controlling all the storage controller 240, a nonvolatile control memory 243 for storing a microprogram (operation software) 250 for controlling the operation of storage controller 240, data for control, cache 245 for temporarily storing (buffering) data, and buffers 244 for assisting the cache 245 to read and write data, a control switch 241 for controlling a protocol to control data transfer to or from the storage devices 230, the data duplication module 255, the similarity index module 257, and the similarity search module 259, in which information may be set. Multiple buffers 244 may be implemented with the present invention to assist with the operations as described herein. In one embodiment, the cluster hosts/nodes, 210, 220, 225 and the storage controller 240 are connected through a network adaptor (this could be a fibre channel) 260 as an interface i.e., via at least one switch called "fabric."

In one embodiment, the host computers or one or more physical or virtual devices, 210, 220, 225 and the storage controller 240 are connected through a network (this could be a fibre channel) 260 as an interface i.e., via at least one switch called "fabric." In one embodiment, the operation of the system shown in FIG. 2 will be described. The microprocessor 242 may control the memory 243 to store command information from the host device (physical or virtual) 210 and information for identifying the host device (physical or virtual) 210. The control switch 241, the buffers 244, the cache 245, the operating software 250, the microprocessor 242, memory 243, NVS 216, predefined Huffman tree module 255, the fast compressor module 257, the Huffman encoder module 259, the linking module 261, and the statistics and performance module 263 are in communication with each other and may be separate or one individual component(s). Also, several, if not all of the components, such as the operation software 250 may be included with the memory 243. Each of the components within the devices shown may be linked together and may be in communication with each other for purposes suited to the present invention. As mentioned above, the predefined Huffman tree module 255, the fast compressor module 257, the Huffman encoder module 259, the linking module 261, and the statistics and performance module 263 may also be located in the cache 245 or other components. As such, the predefined Huffman tree module 255, the fast compressor module 257, the Huffman encoder module 259, the linking module 261, and the statistics and performance module 263 maybe used as needed, based upon the storage architecture and users preferences.

Figure 3:
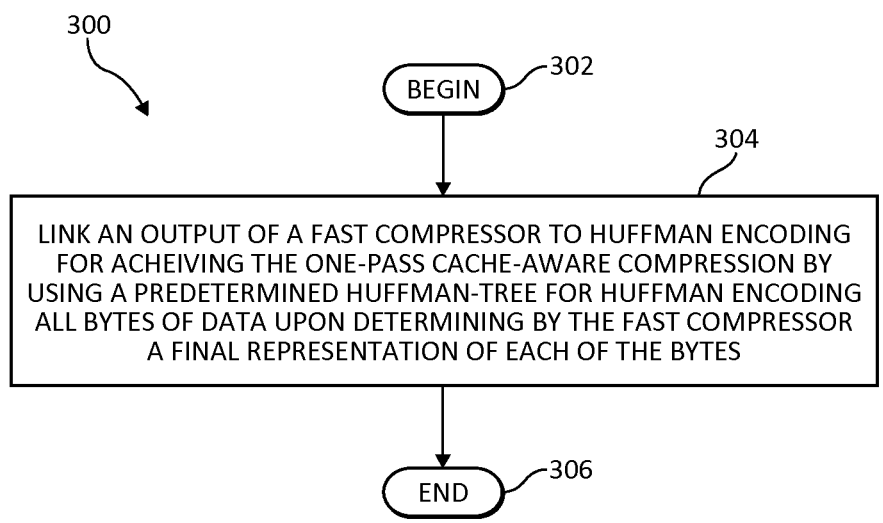
FIG. 3 is a flowchart illustrating an exemplary method for efficient one-pass cache-aware compression in which aspects of the present invention may be realized.

FIG. 3 is a flowchart illustrating an exemplary method 300 for efficient one-pass cache-aware compression in which aspects of the present invention may be realized. The method 300 begins (step 302) by linking an output of a fast compressor to Huffman encoding for achieving the one-pass cache-aware compression by using a predetermined Huffman-tree for Huffman encoding all bytes of data upon determining by the fast compressor a final representation of each of the bytes (step 304). The method 300 ends (step 306).

Figure 4:
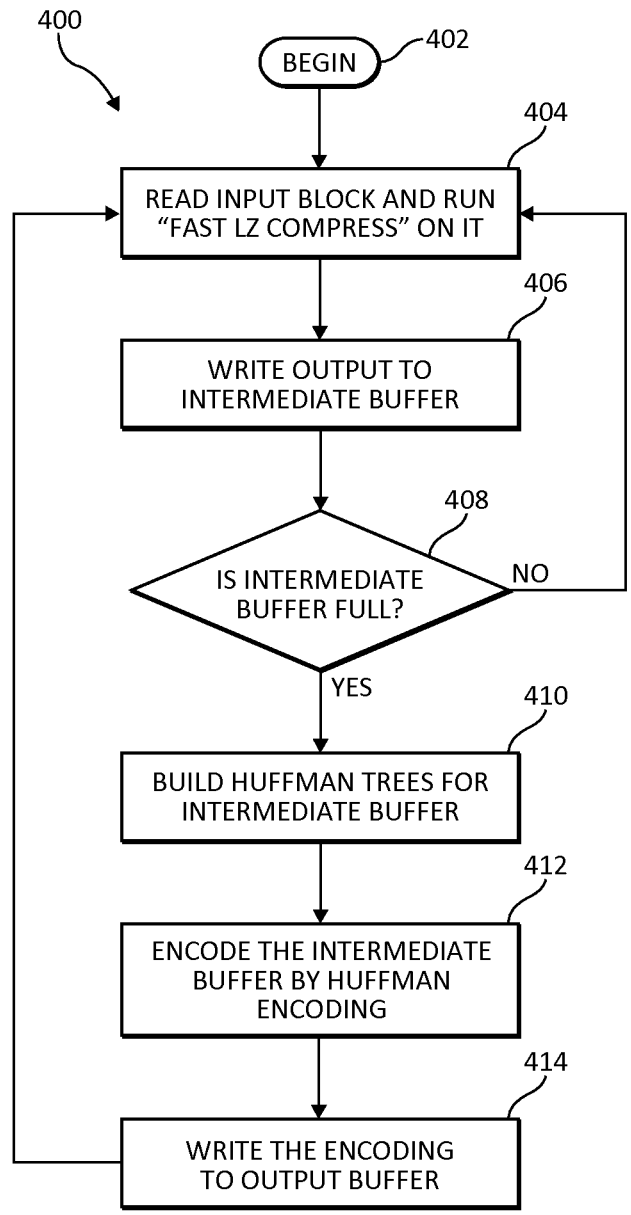
FIG. 4 is a flowchart illustrating a standard combination of a fast compressor with a Huffman encoding implementation.

FIG. 4 is a flowchart illustrating an exemplary method 400 for a standard combination of a fast compressor with a Huffman encoding implementation. This implementation would require a two-pass on the data and reduce the effectiveness of the cache usage. The method 400 begins (step 402) by reading an input block and running a fast compression (e.g., fast LZ compress operation) on the input block (step 404). The method 400 writes an output (e.g., an output of the fast compression) to an intermediate buffer (step 406). The method 400 determines if the intermediate buffer is full (step 408). If no, the method 400 returns to step 402. If yes, the method 400 builds Huffman trees for the intermediate buffer (step 410). The method 400 then encodes the intermediate buffer by the Huffman encoding (step 412). The method 400 writes the Huffman encoding to an output buffer (step 414). The method 400 returns to step 404, but may end when either there is no input to read and/or there is no space in the output to write the Huffman encoding. It should be noted that the freed up fast compressor's (e.g., LZ compressor) output is fed into an internal buffer (e.g., fed into the Zlib's internal buffer). When the buffer is filled, the Huffman process over the buffer is ignited. When the Huffman encoding ends the fast compressor continues its operation, but at this point its important data structures would have been evacuated from the L1 cache.

Figure 5:
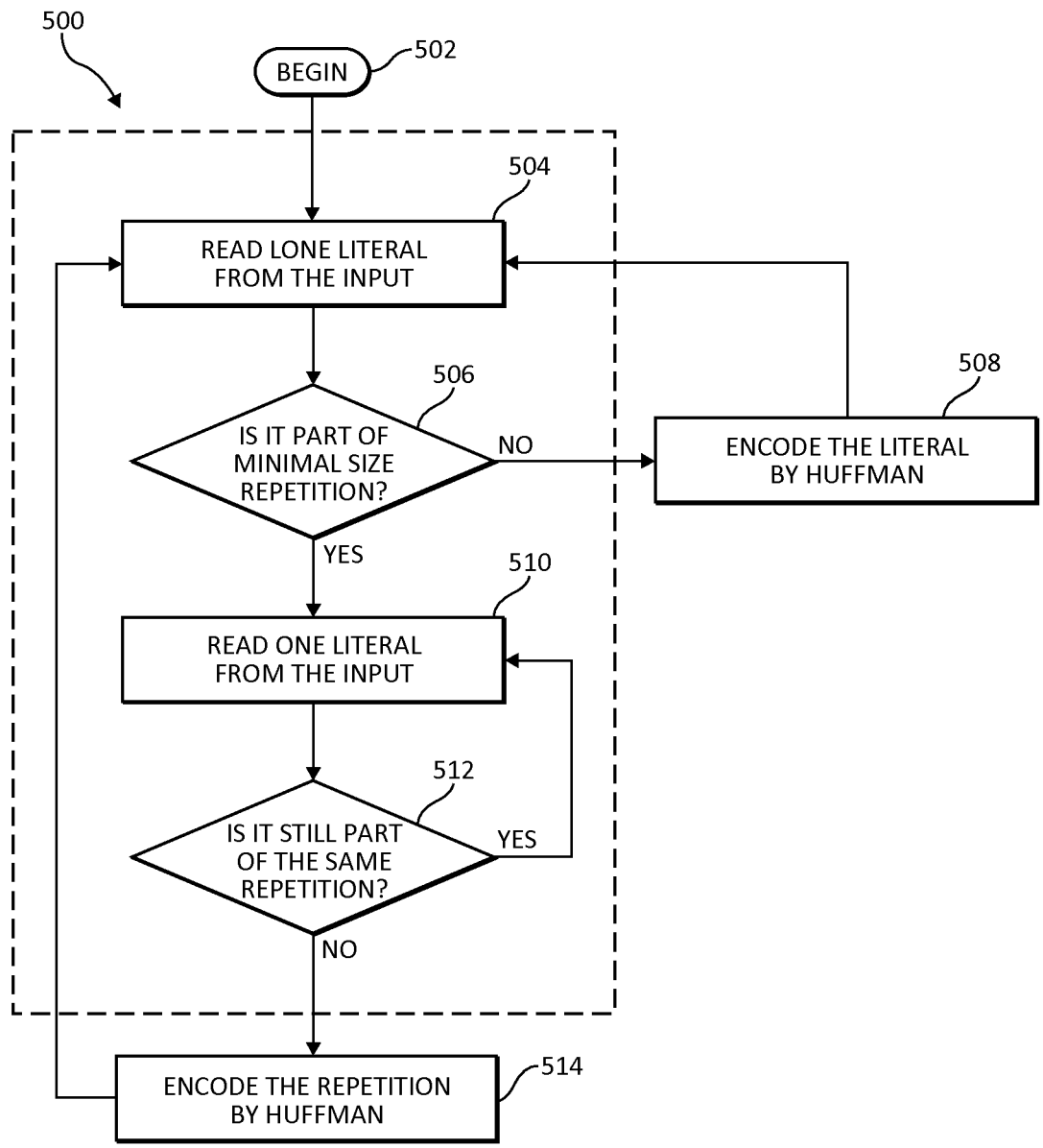
FIG. 5 is a flowchart illustrating an additional exemplary method for efficient one-pass cache-aware compression in which aspects of the present invention may be realized.

FIG. 5 is a flowchart illustrating an exemplary method 500 for efficient one-pass cache-aware compression in which aspects of the present invention may be realized. The method 500 begins (step 502) by reading one literal from an input (step 504). The method 500 determines if the literal is part of a minimal size repetition (step 506). If no, the method 500 Huffman encodes the literal (step 508) and then returns to step 504. If yes, the method 500 reads one literal from the input (step 510). The method 500 determines if the literal is part of the same minimal size repetition (step 512). If yes, the method 500 returns to step 510 and reads one literal from the input (step 510). If no, the method 500 Huffman encodes the repetition (step 514) and then returns to step 506. The method 500 may end when either there is no input to read and/or there is no space in the output to write the Huffman encoding. It should be noted that once the fast compressor (e.g., LZ compressor) is ready to write a byte to the output, it is immediately Huffman encoded. The Huffman operation is local and thus it does not evict the fast compressors essential data structures from the L1-cache.

Figure 6:
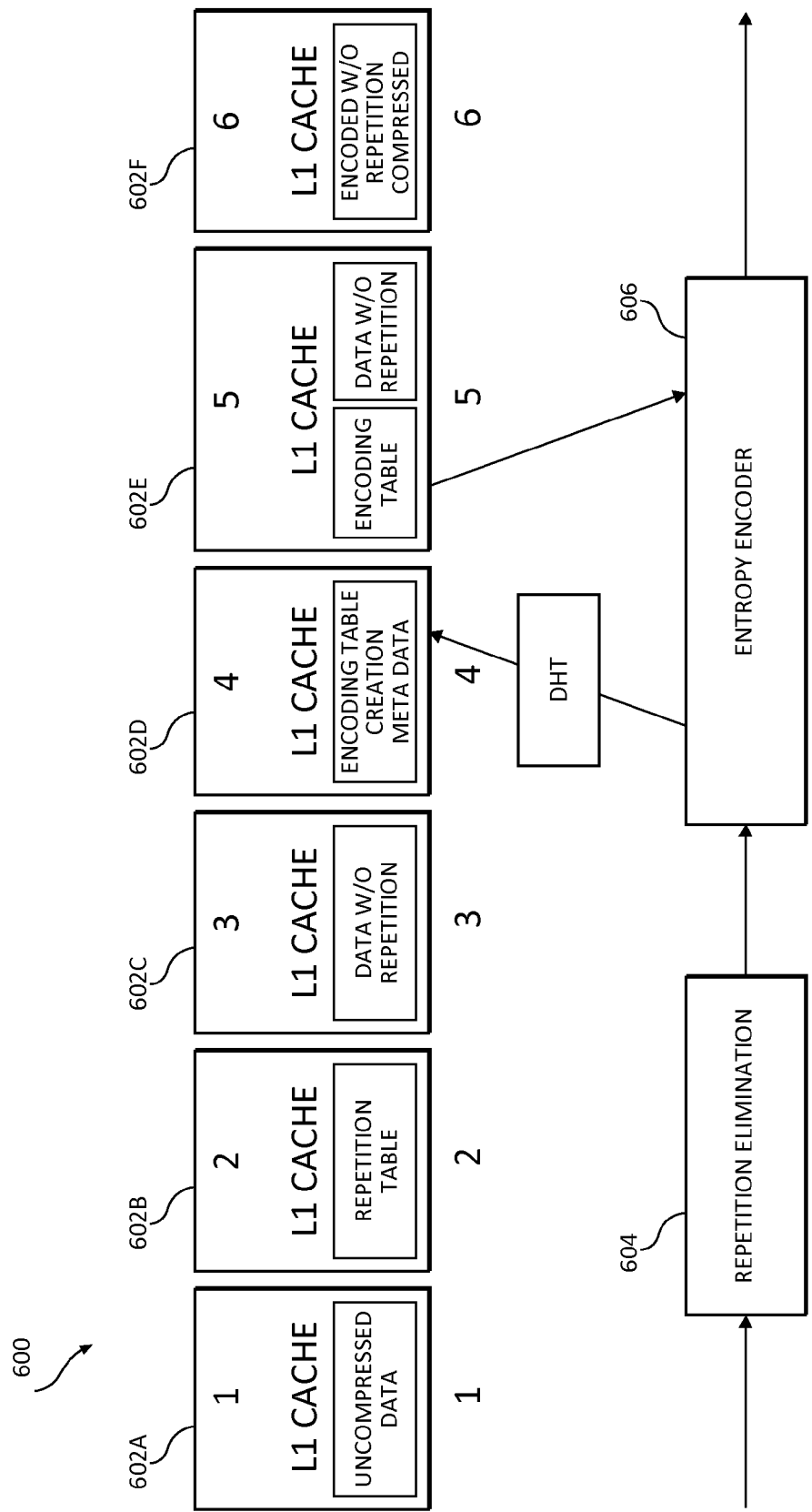
FIG. 6 is a block diagram illustrating cache usage without one-pass cache-aware compression.

FIG. 6 is a block diagram 600 illustrating cache usage without one-pass cache-aware compression. In other words, FIG. 6 illustrates the data that is inserted to the L1 cache during a standard combination of a fast compressor with a Huffman encoding implementation. FIG. 6 illustrates L1 cache (shown as 602A-F in FIG. 6). L1 cache 602A uploads uncompressed data. L2 cache 602B uploads a repetition table. L1 cache 602C uploads data without repetition. L1 cache 602D uploads an encoding table and creation metadata. L1 cache 602E uploads an encoding table and data without repetition. L1 cache 602F contains encoded data without repetition that is compressed. As illustrated in FIG. 6, due to the data flow, some data must be evicted from the L1 cache after the repetition elimination process 604 is finished. For example, by the end of entropy encoding 606 the L1 cache 602F will no longer contain the repetition table, which will have to be reloaded for further compression of the next buffer.

Figure 7:
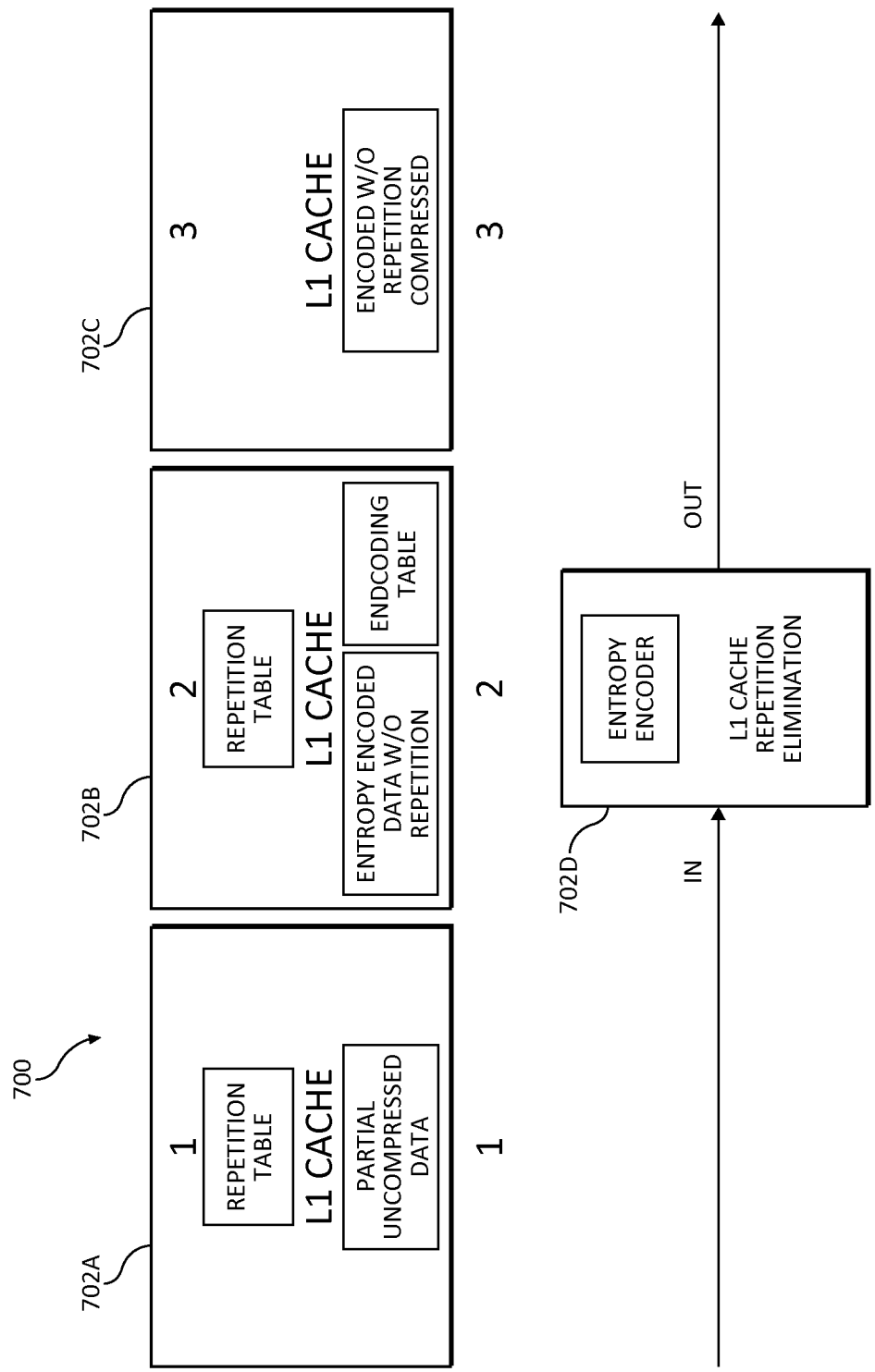
FIG. 7 is a block diagram illustrating efficient cache usage with one-pass cache-aware compression in which aspects of the present invention may be realized.

FIG. 7 is a block diagram 700 illustrating efficient cache usage one-pass cache-aware compression in which aspects of the present invention are realized. In other words, FIG. 7 illustrates the cache contents during an efficient one-pass cache-aware compression. FIG. 7 illustrates L1 cache (shown as 702A-C in FIG. 7). L1 cache 702A contains partial uncompressed data. L1 cache 702B contains an encoding table and entropy encoded data without repetition. L1 cache 702C contains encoded data without repetition that is compressed. L1 cache 702D contains an entropy encoder is a repetition eliminator. As the data is received (e.g., input data) the L1 cache 702D eliminates repetition and links an output of a fast compressor to Huffman encoding for achieving the one-pass cache-aware compression by using a predetermined Huffman-tree for Huffman encoding all bytes of data upon determining by the fast compressor a final representation of each of the bytes. Since the amount of bytes being Huffman encoded remains small, the repetition table does not have to be evicted from the L1 cache and remain highly available for the fast compressor's usage throughout the process. Thus, in one embodiment, the present invention provides real-time compression by linking a fast compressor's output and a Huffman encoding of Deflate in a manner that is essentially one-pass while simultaneously being L1 cache-aware. A key to the present invention is to avoid using a dynamic Huffman tree that is calculated only after the LZ part is finished in L1 cache. The present invention keeps relevant data in the L1 cache during the encoding process, thus saving time by avoiding the need to extract data from L2 cache during the encoding/compression process.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module," "method," "computer program product," and/or "system." Furthermore, aspects of the present invention may take the form of a computer program product embodied in one or more computer readable medium(s) having computer readable program code embodied thereon. It should be noted that one or more processor devices (e.g., a hardware embodiment for operating a software embodiment) may be used to implement, control, authorize, use, manipulate, execute, command, perform, run, process, and/or perform any other activity required by the present invention as described herein.

Any combination of one or more computer readable medium(s) may be utilized. The computer readable medium may be a computer readable signal medium or a computer readable storage medium (e.g., a non-transitory computer readable medium). A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that may contain, or store a program for use by or in connection with an instruction execution system, apparatus, or device.

Program code embodied on a computer readable medium may be transmitted using any appropriate medium, including but not limited to wireless, wired, optical fiber cable, RF, etc., or any suitable combination of the foregoing. Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described above with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, may be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that may direct a computer, other programmable data processing apparatus, or other devices to function in a particular manner, such that the instructions stored in the computer readable medium produce an article of manufacture including instructions which implement the function/act specified in the flowchart and/or block diagram block or blocks. The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagram in the above figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block might occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, may be implemented by special purpose hardware-based systems that perform the specified functions or acts, or combinations of special purpose hardware and computer instructions.

While one or more embodiments of the present invention have been illustrated in detail, one of ordinary skill in the art will appreciate that modifications and adaptations to those embodiments may be made without departing from the scope of the present invention as set forth in the following claims.

What is claimed is:

1. A method for efficient one-pass cache-aware compression by a processor device in a computing storage environment, the method comprising:
    linking an output of a fast compressor to Huffman encoding for achieving the one-pass cache-aware compression by using a predetermined Huffman-tree upon determining by the fast compressor a final representation of each data byte; and
    retaining relevant data in an L1 cache during the Huffman encoding process without extracting data from an L2 cache during the Huffman encoding.

2. The method of claim 1, further including computing the predetermined Huffman-tree based a plurality of statistic collected on a prefix of data and using the predetermined Huffman-tree for subsequent encoding.

3. The method of claim 1, further including recalculating the predetermined Huffman-tree after every an X number of encoded bytes, wherein the X is a value that is one of a predetermined value and a computed value calculated on the plurality of statistics and historical performance.

4. The method of claim 1, further including selecting at least one of a plurality of predetermined Huffman-trees based on one of a plurality of information and historical performance for the linking.

5. The method of claim 1, further including adding an internal state to the fast compressor and saving the internal state between consequent calls to a compression stream.

6. The method of claim 1, further including performing at least one of:
    reading a literal from an input of data,
    determining if the literal is part of a minimal size repetition,
    Huffman encoding the literal, and
    Huffman encoding the minimal size repetition.

7. The method of claim 1, further including immediately Huffman encoding a byte when the fast compressor is ready to write a byte to the final representation output.

8. A system for efficient one-pass cache-aware compression in a computing environment, comprising:
    a processor device operable in the computing environment, wherein processor device:
        links an output of a fast compressor to Huffman encoding for achieving the one-pass cache-aware compression by using a predetermined Huffman-tree upon determining by the fast compressor a final representation of each data byte, and
        retains relevant data in an L1 cache during the Huffman encoding process without extracting data from an L2 cache during the Huffman encoding.

9. The system of claim 8, wherein the processor device computes the predetermined Huffman-tree based a plurality of statistic collected on a prefix of data and using the predetermined Huffman-tree for subsequent encoding.

10. The system of claim 8, wherein the processor device recalculates the predetermined Huffman-tree after every an X number of encoded bytes, wherein the X is a value that is one of a predetermined value and a computed value calculated on the plurality of statistics and historical performance.

11. The system of claim 8, wherein the processor device selects at least one of a plurality of predetermined Huffman-trees based on one of a plurality of information and historical performance for the linking.

12. The system of claim 8, wherein the processor device performs at least one of:
   adding an internal state to the fast compressor and saving the internal state between consequent calls to a compression stream,
   reading a literal from an input of data,
   determining if the literal is part of a minimal size repetition,
   Huffman encoding the literal, and
   Huffman encoding the minimal size repetition.

13. The system of claim 8, wherein the processor device immediately Huffman encodes a byte when the fast compressor is ready to write a byte to the final representation output.

14. A computer program product for efficient one-pass cache-aware compression in a computing environment by a processor device, the computer program product comprising a non-transitory computer-readable storage medium having computer-readable program code portions stored therein, the computer-readable program code portions comprising:
   a first executable portion that links an output of a fast compressor to Huffman encoding for achieving the one-pass cache-aware compression by using a predetermined Huffman-tree upon determining by the fast compressor a final representation of each data byte; and
   a second executable portion that retains relevant data in an L1 cache during the Huffman encoding process without extracting data from an L2 cache during the Huffman encoding.

15. The computer program product of claim 14, further including a third executable portion that performs one of:
   computing the predetermined Huffman-tree based a plurality of statistic collected on a prefix of data and using the predetermined Huffman-tree for subsequent encoding, and
   recalculating the predetermined Huffman-tree after every an X number of encoded bytes, wherein the X is a value that is one of a predetermined value and a computed value calculated on the plurality of statistics and historical performance, and
   selects at least one of a plurality of predetermined Huffman-trees based on one of a plurality of information and historical performance for the linking.

16. The computer program product of claim 14, further including a third executable portion that performs at least one of:
   adding an internal state to the fast compressor and saving the internal state between consequent calls to a compression stream,
   reading a literal from an input of data,
   determining if the literal is part of a minimal size repetition,
   Huffman encoding the literal, and
   Huffman encoding the minimal size repetition.

17. The computer program product of claim 14, further including a third executable portion that immediately Huffman encodes a byte when the fast compressor is ready to write a byte to the final representation output.

* * * * *